(12) United States Patent
Yuan et al.

(10) Patent No.: US 9,970,997 B2
(45) Date of Patent: May 15, 2018

(54) MAGNETIC FIELD SENSING APPARATUS AND MAGNETIC FIELD SENSING MODULE

(71) Applicants: Fu-Te Yuan, New Taipei (TW);
Pei-Chun Kao, New Taipei (TW);
Meng-Huang Lai, New Taipei (TW)

(72) Inventors: Fu-Te Yuan, New Taipei (TW);
Pei-Chun Kao, New Taipei (TW);
Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 48 days.

(21) Appl. No.: 15/147,915

(22) Filed: May 6, 2016

(65) Prior Publication Data
US 2016/0327618 A1 Nov. 10, 2016

Related U.S. Application Data

(60) Provisional application No. 62/158,553, filed on May 8, 2015.

(30) Foreign Application Priority Data

Mar. 11, 2016 (TW) .............................. 105107616 A

(51) Int. Cl.
*G01R 33/02* (2006.01)
*G01R 33/09* (2006.01)
*G01C 17/28* (2006.01)

(52) U.S. Cl.
CPC ........... *G01R 33/096* (2013.01); *G01C 17/28* (2013.01); *G01R 33/0206* (2013.01); *G01R 33/091* (2013.01)

(58) Field of Classification Search
CPC .. G01R 33/093; G01R 33/0029; G01R 33/02; G01R 33/072; G01R 33/07;
(Continued)

(56) References Cited

U.S. PATENT DOCUMENTS 5,952,825 A * 9/1999 Wan ....................... B82Y 25/00
324/252
7,126,330 B2 10/2006 Peczalski et al.
(Continued)

FOREIGN PATENT DOCUMENTS

TW 201423136 6/2014

*Primary Examiner* — Thang Le
(74) *Attorney, Agent, or Firm* — JCIPRNET

(57) ABSTRACT

A magnetic field sensing apparatus including a substrate, first, second, and third magnetic field sensing units, and a switching circuit is provided. The substrate has a surface, and has a first inclined surface and a second inclined surface. The first magnetic field sensing unit includes a plurality of magnetoresistance sensors connected together to form a Wheatstone full bridge and disposed on the surface. The second magnetic field sensing unit includes a plurality of magnetoresistance sensors connected together to form a Wheatstone half bridge and disposed on the first inclined surface. The third magnetic field sensing unit includes a plurality of magnetoresistance sensors connected together to form a Wheatstone half bridge and disposed on the second inclined surface. The switching circuit electrically connects the second magnetic field sensing unit and the third magnetic field sensing unit. A magnetic field sensing module is also provided.

18 Claims, 6 Drawing Sheets

(58) Field of Classification Search
CPC ........ G01R 33/0023; G01B 7/30; G01B 7/14;
G01B 7/03; G01D 5/145; G01D 11/345;
G01P 3/443; G01P 3/448; G01P 3/447;
G01P 3/665; H04M 1/0245; H04M
1/0216
USPC .......... 324/252, 244, 207.2, 207.21, 207.24,
324/207.25, 173, 174, 179
See application file for complete search history.

(56) References Cited

U.S. PATENT DOCUMENTS

| | | | |
|---|---|---|---|
| 8,525,514 B2 * | 9/2013 | Cai | B82Y 25/00 324/252 |
| 9,018,946 B2 * | 4/2015 | Paci | B82Y 25/00 324/228 |
| 9,372,242 B2 * | 6/2016 | Qiu | G01R 33/096 |
| 2012/0161759 A1 * | 6/2012 | Pozzati | B82Y 25/00 324/252 |
| 2013/0207645 A1 | 8/2013 | Kong | |
| 2013/0320972 A1 * | 12/2013 | Loreit | B82Y 25/00 324/252 |
| 2014/0015525 A1 * | 1/2014 | Paci | G01R 33/0017 324/252 |

* cited by examiner

MAGNETIC FIELD SENSING APPARATUS AND MAGNETIC FIELD SENSING MODULE

CROSS-REFERENCE TO RELATED APPLICATION

This application claims the priority benefits of U.S. provisional application Ser. No. 62/158,553, filed on May 8, 2015, and Taiwan application serial no. 105107616, filed on Mar. 11, 2016. The entirety of each of the above-mentioned patent applications is hereby incorporated by reference herein and made a part of this specification.

BACKGROUND OF THE INVENTION

1. Field of the Invention

The invention relates to a magnetic field sensing apparatus and a magnetic field sensing module.

2. Description of Related Art

As portable electronic apparatuses become more and more popular, the technology of electronic compass capable of sensing the geomagnetic direction becomes highly valued. When the electronic compass is used in a small-sized portable electronic apparatus (e.g., smart phone), it is desired that the electronic compass permits tri-axial sensing in addition to meeting the requirement on size, because the user may hold the phone inclinedly when holding the phone with his/her hand, and the phone may be held at various different angles.

In the conventional technology, a composite sensing element is used to accomplish tri-axial sensing. Specifically, tri-axial sensing is accomplished by using two giant magnetoresistance (GMR) multilayer film structure (or tunneling magnetoresistance (TMR) multi-layer film structure) and a Hall element disposed perpendicular to each other. However, since the sensing sensitivity of the Hall element is different from the sensing sensitivity of the GMR (or TMR) multilayer film structure, the difference may make the precision on one of the axes different from the precision on the other two axes. Thus, when the user rotates the portable electronic apparatus to a different angle, the sensing sensitivity to the same magnetic field may become different, thus causing confusion.

In the conventional art, in order to accomplish multi-axial sensing of magnetic field, it is common to adopt two or more manufacturing processes. Namely, a multi-axial magnetic field sensing module requires two or more wafers to be manufactured. The manufacturing processes are thus complicated, so it is difficult to reduce the manufacturing cost. Moreover, such manufacturing processes also make it difficult to further reduce the size of the magnetic field sensing apparatus.

SUMMARY OF THE INVENTION

The invention provides a magnetic field sensing apparatus having a simplified structure as well as a smaller size.

The invention provides a magnetic field sensing module having a simplified structure as well as a smaller size.

An embodiment of the invention provides a magnetic field sensing apparatus, including a substrate, a first magnetic field sensing unit, a second magnetic field sensing unit, a third magnetic field sensing unit, and a switching circuit. The substrate has a surface and a first inclined surface and a second inclined surface inclined in different directions with respect to the surface. The first magnetic field sensing unit includes a plurality of magnetoresistance sensors connected to form a Wheatstone full bridge and disposed on the surface and is configured to sense a magnetic field component in a first direction. The second magnetic field sensing unit includes a plurality of magnetoresistance sensors connected to form a Wheatstone half bridge and disposed on the first inclined surface. The third magnetic field sensing unit includes a plurality of magnetoresistance sensors connected to form a Wheatstone half bridge and disposed on the second inclined surface. The switching circuit electrically connects the second magnetic field sensing unit and the third magnetic field sensing unit and is configured to switch the second magnetic field sensing unit and the third magnetic field sensing unit to two different Wheatstone full bridges. The two different Wheatstone full bridges are respectively configured to sense a magnetic field component in a second direction and a magnetic field component in a third direction.

According to an embodiment of the invention, the magnetoresistance sensors of the first magnetic field sensing unit, the second magnetic field sensing unit, and the third magnetic field sensing unit are anisotropic magnetoresistance (AMR) sensors.

According to an embodiment of the invention, the first direction, the second direction, and the third direction are substantially perpendicular to each other.

According to an embodiment of the invention, at least two of the first direction, the second direction, and the third direction are not perpendicular to each other.

According to an embodiment of the invention, sensing axes of the magnetoresistance sensors of the second magnetic field sensing unit are substantially parallel to an inclinedly extending direction of the first inclined surface, and sensing axes of the magnetoresistance sensors of the third magnetic field sensing unit are substantially parallel to an inclinedly extending direction of the second inclined surface.

According to an embodiment of the invention, sensing axes of the magnetoresistance sensors of the first magnetic field sensing unit are substantially perpendicular to the inclinedly extending direction of the first inclined surface and perpendicular to the inclinedly extending direction of the second inclined surface.

According to an embodiment of the invention, the magnetic field sensing apparatus further includes a first magnetization direction setting element and a second magnetization direction setting element. The first magnetization direction setting element is disposed beside the first magnetic field sensing unit and configured to set the magnetization directions of the magnetoresistance sensors of the first magnetic field sensing unit. The second magnetization direction setting element is disposed beside the second magnetic field sensing unit and the third magnetic field sensing unit and configured to set magnetization directions of the magnetoresistance sensors of the second magnetic field sensing unit and the third magnetic field sensing unit.

An embodiment of the invention provides a magnetic field sensing module. The magnetic field sensing module includes a magnetic field sensing unit and a magnetization direction setting element. The magnetic field sensing unit includes a plurality of magnetoresistance sensors connected to form a Wheatstone bridge and is configured to sense a magnetic field component in a direction. The magnetization direction setting element is disposed beside the magnetic field sensing unit and configured to set magnetization directions of the magnetoresistance sensors of the magnetic field sensing unit. The magnetization direction setting element includes a first spiral conductive unit, a second spiral conductive unit, and a third spiral conductive unit. The second spiral conductive unit is electrically connected between the first spiral conductive unit and the third spiral conductive unit, and a spirally extending direction of the second spiral conductive unit is different from a spirally extending direction of the first spiral conductive unit and different from a spirally extending direction of the third spiral conductive unit.

According to an embodiment of the invention, when a current sequentially flows through the first spiral conductive unit, the second spiral conductive unit, and the third spiral conductive unit, a current right above or right below the magnetoresistance sensors belonging to a half bridge of the Wheatstone full bridge flows in a first direction, a current right above or right below the magnetoresistance sensors belonging to the other half of the Wheatstone bridge flows in a second direction, and the first direction is opposite to the second direction.

An embodiment of the invention provides a magnetic field sensing module. The magnetic field sensing module includes a magnetic field sensing unit and a magnetization direction setting element. The magnetic field sensing unit includes a plurality of magnetoresistance sensors connected to form a Wheatstone bridge and is configured to sense a magnetic field component in a direction. The magnetization direction setting element is disposed beside the magnetic field sensing unit and configured to set magnetization directions of the magnetoresistance sensors of the magnetic field sensing unit. The magnetization direction setting element includes a plurality of first conductive segments, a plurality of second conductive segments, a plurality of first conductive vias, and a plurality of second conductive vias. The first conductive segments are disposed on one of an upper side and a lower side of the magnetic field sensing unit, and the second conductive segments are disposed on the other of the upper side and the lower side of the magnetic field sensing unit. The first conductive vias connect a portion of the first conductive segments and a portion of the second conductive segments to form a first spiral conductive unit. The second conductive vias connect another portion of the first conductive segments and another portion of the second conductive segments to form a second spiral conductive unit. In addition, a spirally extending direction of the first spiral conductive unit is different from a spirally extending direction of the second spiral conductive unit.

According to an embodiment of the invention, one of the first conductive segments is a U-shaped conductive segment, a portion of the U-shaped conductive segment belongs to the first spiral conductive unit, and another portion of the U-shaped conductive segment belongs to the second spiral conductive unit.

According to an embodiment of the invention, the first conductive segments and the second conductive segments are partially overlapped.

In the magnetic field sensing apparatus according to the embodiments of the invention, since the second magnetic field sensing unit and the third magnetic field sensing unit may form two different Wheatstone full bridges through circuit switching, so as to sense the magnetic field components in the second direction and the third direction, respectively, the magnetic field sensing apparatus is able to sense the magnetic field components in three directions by using fewer magnetoresistance sensors. Thus, the framework of the magnetic field sensing apparatus may be simplified, and the size of the magnetic field sensing apparatus may be reduced. In the magnetic field sensing module according to the embodiments of the invention, since the spirally extending direction of the second spiral conductive unit is different from the spirally extending direction of the first spiral conductive unit and different from the spirally extending direction of the third spiral conductive unit, the magnetization directions of the magnetoresistance sensors of the magnetic field sensing units may be set effectively by simply using three spiral conductive units. Thus, the magnetic field sensing module according to the embodiments of the invention has a simpler framework and a smaller size. In the magnetic field sensing module according to the embodiments of the invention, since the spirally extending direction of the first spiral conductive unit is different from the spirally extending direction of the second spiral conductive unit, the magnetization directions of the magnetoresistance sensors of the magnetic field sensing units may be effectively set by simply using the first conductive segments, the second conductive segments, and the conductive vias. Thus, the magnetic field sensing module according to the embodiments of the invention has a simpler framework and a smaller size.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
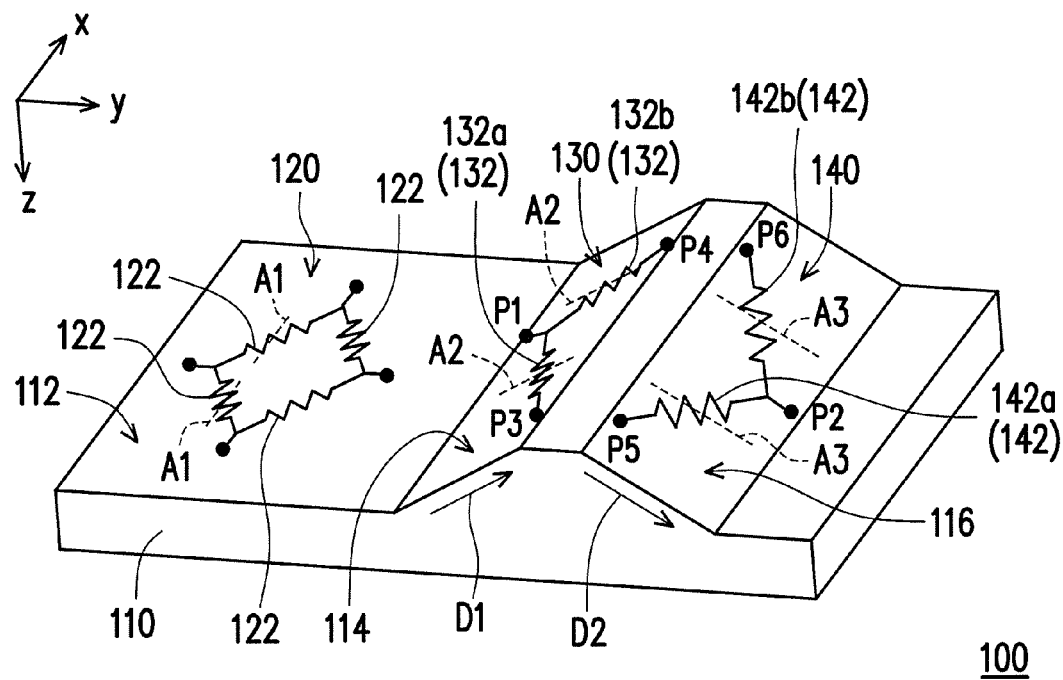
FIG. 1A is a schematic perspective view illustrating a magnetic field sensing apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
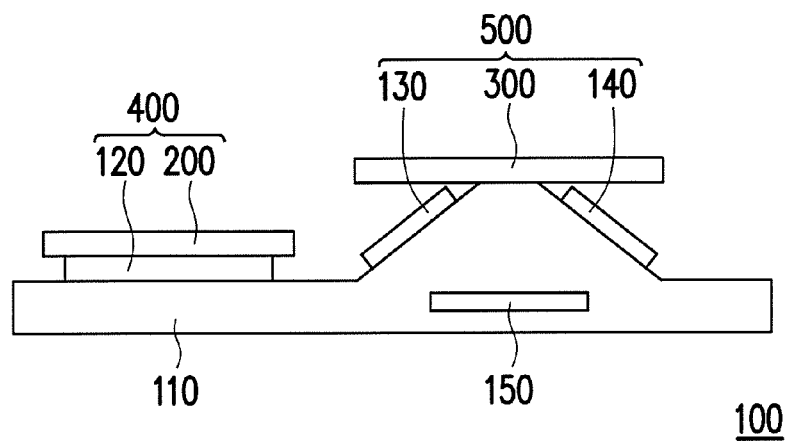
FIG. 1B is a schematic cross-sectional view illustrating the magnetic field sensing apparatus of FIG. 1A.
Figure 1C:
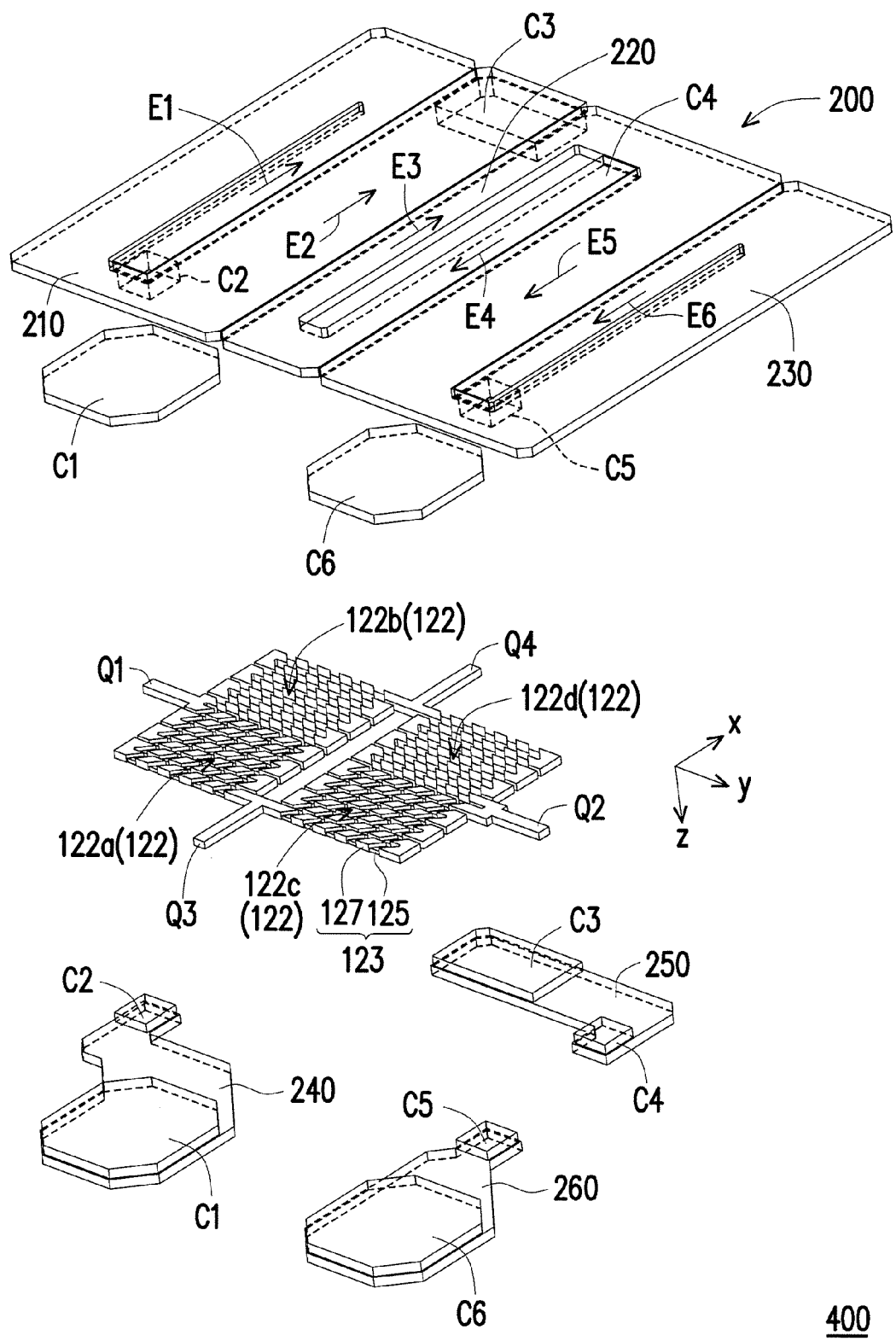
FIG. 1C is an exploded view illustrating the magnetic field sensing module of FIG. 1A.

FIG. 1A is a schematic perspective view illustrating a magnetic field sensing apparatus according to an embodiment of the invention, FIG. 1B is a schematic cross-sectional view illustrating the magnetic field sensing apparatus of FIG. 1A, and FIG. 1C is an exploded view illustrating the magnetic field sensing apparatus of FIG. 1A. For the ease of illustration, FIG. 1A omits a magnetization direction setting element of FIG. 1B. Referring to FIGS. 1A to 1C, a magnetic field sensing apparatus 100 of this embodiment includes a substrate 110, a first magnetic field sensing unit 120, a second magnetic field sensing unit 130, a third magnetic field sensing unit 140, and a switching circuit 150, as shown in FIG. 1B. The substrate 110 has a surface 112 as well as a first inclined surface 114 and a second inclined surface 116 inclined in different directions with respect to the surface 112. In this embodiment, the substrate 110 is a blank silicon substrate, a glass substrate, or a silicon substrate having a vary large scale integrated circuit (VLSI) or a large scale integrated circuit (LSI), for example.

The first magnetic field sensing unit 120 includes a plurality of magnetoresistance sensors 122 connected to form a Wheatstone full bridge and disposed on the surface 112. The first magnetic field sensing unit 120 is configured to sense a magnetic field component in a first direction (e.g., x-direction). The second magnetic field sensing unit 130 includes a plurality of magnetoresistance sensors 132 connected to form a Wheatstone half bridge and disposed on the first inclined surface 114. The third magnetic field sensing unit 140 includes a plurality of magnetoresistance sensors 142 connected to form a Wheatstone half bridge and disposed on the second inclined surface 116. The switching circuit 150 electrically connects the second magnetic field sensing unit 130 and the third magnetic field sensing unit 140 and configured to switch the second magnetic field sensing unit 130 and the third magnetic field sensing unit 140 to two different Wheatstone full bridges. The two different Wheatstone full bridge are respectively configured to sense a magnetic field component in a second direction (e.g., y-direction) and a magnetic field component in a third direction (e.g., z-direction). In this embodiment, the x-direction, the y-direction, and the z-direction are perpendicular to each other. In other words, in this embodiment, the first direction, the second direction, and the third direction are substantially perpendicular to each other. However, in other embodiments, at least two of the first direction, the second direction, and the third direction are not perpendicular to each other, and the first direction, the second direction, and the third direction are directions different from each other. In this embodiment, the x-direction and the y-direction are substantially parallel to the surface 112 of the substrate 110, and the z-direction is perpendicular to the surface 112 of the substrate 110.

In this embodiment, the magnetoresistance sensors 122, 132, and 142 of the first magnetic field sensing unit 120, the second magnetic field sensing unit 130, and the third magnetic field sensing unit 140 are anisotropic magnetoresistance (AMR) sensors. However, in other embodiments, the magnetoresistance sensors 122, 132, and 142 may also be giant magnetoresistance (GMR) sensors, tunneling magnetoresistance (TMR) sensors, flux gates, or magneto-impedance sensors.

In this embodiment, sensing axes A1 of the magnetoresistance sensors 122 of the first magnetic field sensing unit 120 are substantially perpendicular to an inclinedly extending direction D1 of the first inclined surface 114 and perpendicular to an inclinedly extending direction D2 of the second inclined surface 116, as shown in FIGS. 1A and 1C. More specifically, in this embodiment, each magnetoresistance sensor 122 may include a plurality of anisotropic magentoresistors 123 connected in series. An extending direction of each anisotropic magnetoresistor 123 is substantially parallel to the y-direction, and a short axis of each anisotropic magnetoresistor 123 is substantially parallel to the x-direction. In addition, the short axis is the sensing axis A1 of the magnetoresistance sensor 122.

In this embodiment, magnetization directions of magnetoresistance sensors 122a and 122b are toward a −y-direction, for example, and magnetization directions of the magnetoresistance sensors 122c and 122d are toward a +y-direction, for example. In addition, each anisotropic magnetoresistor 123 has a barber pole structure. Namely, a surface of the anisotropic magnetoresistor 123 is provided with a plurality of electrical shorting bars 127 inclinedly extending at 45 degrees with respect to the extending direction (e.g., y-direction) of the anisotropic magnetoresistor 123. The electrical shorting bars 127 are arranged separately and in parallel on a ferromagnetic film 125. The ferromagnetic film 125 is a body of the anisotropic magnetoresistor 123, and an extending direction of the ferromagnetic film 125 is the extending direction of the anisotropic magnetoresistor 123. In this embodiment, the extending direction of the electrical shorting bars 127 of the magnetoresistance sensor 122a and the extending direction of the electrical shorting bars 127 of the magnetoresistance sensor 122c are substantially the same, and the extending direction of the electrical shorting bars 127 of the magnetoresistance sensor 122b and the extending direction of the electrical shorting bars 127 of the magnetoresistance sensor 122d are substantially the same, but the extending direction of the electrical shorting bars 127 of the magnetoresistance sensor 122a and the extending direction of the electrical shorting bars 127 of the magnetoresistance sensor 122b are different, for example, different by 90 degrees.

By arranging the magnetization directions of the magnetoresistance sensors 122a to 122d and the directions of the electrical shorting bars 127, when an external magnetic field has a magnetic field component in a +x-direction, resistances of the magnetoresistance sensors 122b and 122c may exhibit a change of +ΔR, whereas resistances of the magnetoresistance sensors 122b and 122c may exhibit a change of −ΔR. Thus, when a voltage difference is applied to a terminal Q1 and a terminal Q2, a voltage difference may be present at a terminal Q3 and a terminal Q4. The size of the voltage difference is positively correlated to the magnitude of the magnetic field component in the x-direction. In this way, the magnitude of the magnetic field component in the x-direction is known by utilizing the voltage difference at the terminal Q3 and the terminal Q4. Thus, the first magnetic field sensing unit 120 is able to sense the magnetic field component in the x-direction.

It should be noted that the arrangement of the magnetization directions of the magnetoresistance sensors 122a to 122d and the directions of the electrical shorting bars 127 is not limited to the above. In other embodiments, the magnetization directions of the magnetoresistance sensors 122a to 122d and the directions of the electrical shorting bars 127 may be arranged in different directions, as long as a voltage difference is generated at the terminal Q3 and the terminal Q4 when the magnetic field component in the x-direction is present and a voltage difference is applied to the terminal Q1 and the terminal Q2, or as long as a voltage difference is generated at the terminal Q1 and the terminal Q2 when the magnetic field component in the x-direction is present and a voltage difference is applied to the terminal Q3 and the terminal Q4.

In this embodiment, sensing axes A2 of the magnetoresistance sensors 132 of the second magnetic field sensing unit 130 are substantially parallel to the inclinedly extending direction D1 of the first inclined surface 114, and sensing axes A3 of the magnetoresistance sensors 142 of the third magnetic field sensing unit 140 are substantially parallel to the inclinedly extending direction D2 of the second inclined surface 116. Specifically, an extending direction of a plurality of serially connected anisotropic magnetoresistors of each magnetoresistance sensor 132 is substantially parallel to the x-direction, and the anisotropic magnetoresistors are parallel to each other and arranged on the first inclined surface 114 along the inclinedly extending direction D1. Moreover, an included angle between an extending direction of electrical shorting bars of each magnetoresistance sensor 132 and the extending direction of the anisotropic magnetoresistors thereof is 45 degrees. Furthermore, an extending direction of a plurality of serially connected anisotropic magnetoresistors of each magnetoresistance sensor 142 is substantially parallel to the x-direction, and the anisotropic magnetoresistors are parallel to each other and arranged on the second inclined surface 116 along the inclinedly extending direction D2. Besides, an included angle between an extending direction of electrical shorting bars of each magnetoresistance sensor 142 and the extending direction of the anisotropic magnetoresistors thereof is 45 degrees.

Figure 2A:
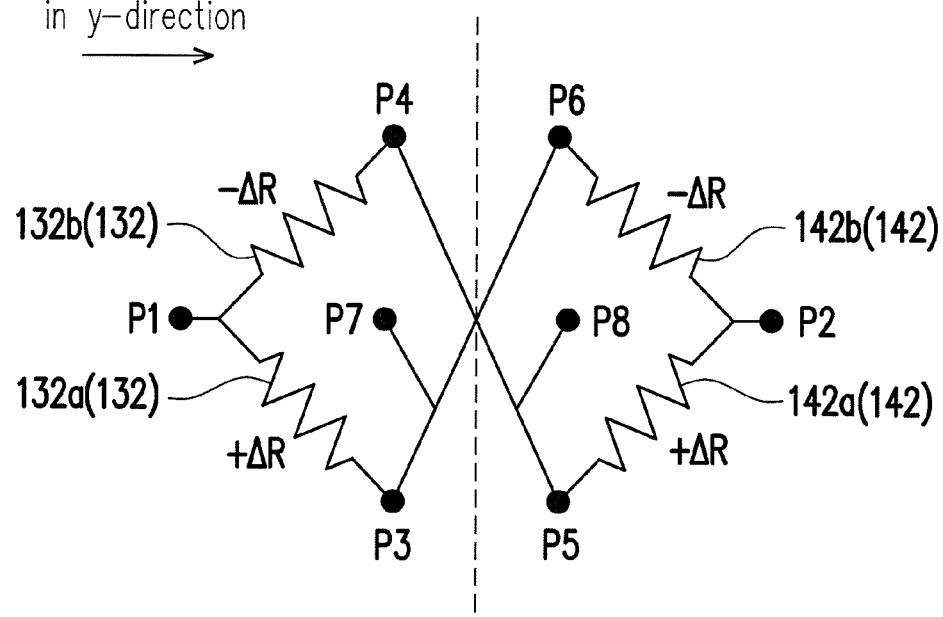
FIG. 2A is an equivalent circuit diagram illustrating a second magnetic field sensing unit and a third magnetic field sensing unit of FIG. 1A sensing a magnetic field component in a y-direction.
Figure 2B:
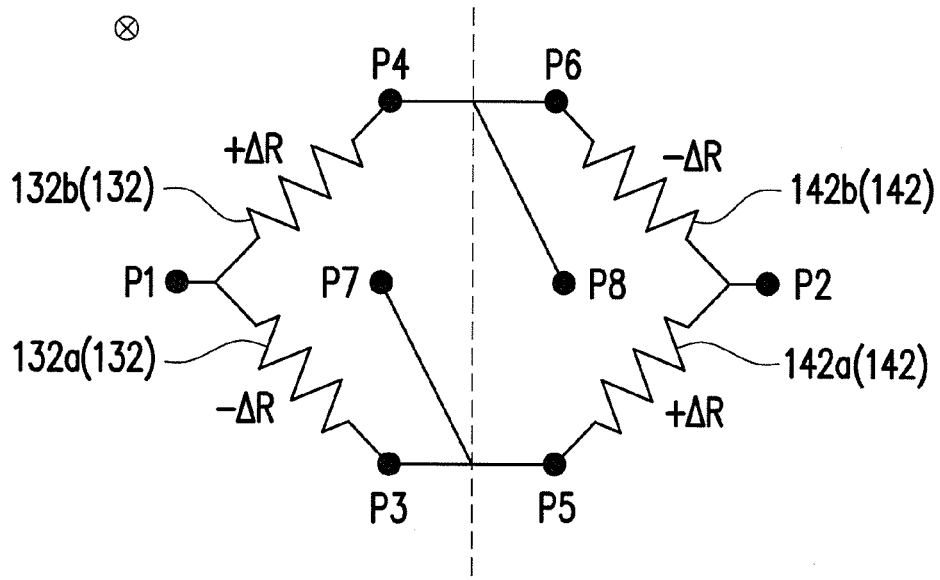
FIG. 2B is an equivalent circuit diagram illustrating a second magnetic field sensing unit and a third magnetic field sensing unit of FIG. 1A sensing a magnetic field component in a z-direction.

FIG. 2A is an equivalent circuit diagram illustrating a second magnetic field sensing unit and a third magnetic field sensing unit of FIG. 1A sensing a magnetic field component in the y-direction, and FIG. 2B is an equivalent circuit diagram illustrating a second magnetic field sensing unit and a third magnetic field sensing unit of FIG. 1A sensing a magnetic field component in the z-direction. Referring to FIGS. 1A and 2A, when the external magnetic field has a magnetic field component in the +y-direction, by suitably arranging the magnetization directions of the magnetoresistance sensors 132 and 142 and the extending directions of the electrical shorting bars, resistances of magnetoresistance sensors 132a and 142a may exhibit a change of +ΔR, and resistances of magnetoresistance sensors 132b and 142b may exhibit a change of −ΔR. Under this circumstance, by switching of the switching circuit 150, a terminal P3 and a terminal P6 may be electrically connected to a terminal P7, and a terminal P4 and a terminal P5 may be electrically connected to a terminal P8, such that the second magnetic field sensing unit 130 and the third magnetic field sensing unit 140 are electrically connected to form a Wheatstone full bridge. At this time, a voltage difference is applied to a terminal P1 and a terminal P2, such that a voltage difference is generated between the terminal P7 and the terminal P8. In addition, an absolute value of the voltage difference between the terminal P7 and the terminal P8 is positively correlated with an absolute value of the magnetic field component in the y-direction. In this way, the magnitude of the magnetic field component in the y-direction may be known by utilizing the voltage difference between the terminal P7 and the terminal P8. Thus, the second magnetic field sensing unit 130 and the third magnetic field sensing unit 140 are able to sense the magnetic field component in the y-direction.

Referring to FIGS. 1A and 2B, when the external magnetic field has a magnetic field component in a +z-direction, the resistances of the magnetoresistance sensors 132b and 142a may exhibit a change of +ΔR, and the resistances of the magnetoresistance sensors 132a and 142b may exhibit a change of −ΔR. Under this circumstance, by switching of the switching circuit 150, the terminal P3 and the terminal P5 may be electrically connected to the terminal P7, and the terminal P4 and the terminal P6 may be electrically connected to the terminal P8, such that the second magnetic field sensing unit 130 and the third magnetic field sensing unit 140 are electrically connected to form another Wheatstone full bridge. At this time, a voltage difference is applied to the terminal P1 and the terminal P2, such that a voltage difference is generated between the terminal P7 and the terminal P8. In addition, an absolute value of the voltage difference between the terminal P7 and the terminal P8 is positively correlated with an absolute value of the magnetic field component in the z-direction. In this way, the magnitude of the magnetic field component in the z-direction may be known by utilizing the voltage difference between the terminal P7 and the terminal P8. Thus, the second magnetic field sensing unit 130 and the third magnetic field sensing unit 140 are able to sense the magnetic field component in the z-direction.

In the magnetic field sensing apparatus 100 of this embodiment, since the second magnetic field sensing unit 130 and the third magnetic field sensing unit 140 may form two different Wheatstone full bridges through circuit switching, so as to sense the magnetic field components in the second direction (e.g., y-direction) and the third direction (e.g., z-direction), respectively, the magnetic field sensing apparatus 100 is able to sense the magnetic field components in three directions by using fewer magnetoresistance sensors 122, 132, and 142. Thus, the framework of the magnetic field sensing apparatus 100 may be simplified, and the size of the magnetic field sensing apparatus 100 may be reduced. Moreover, by switching the second magnetic field sensing unit 130 and the third magnetic field sensing unit 140 to form the Wheatstone full bridges for sensing the second direction and the third direction by using the switching circuit 150, signals corresponding to the magnetic field component in the second direction and the magnetic field component in the third direction may be directly output from the two Wheatstone full bridges, instead of being obtained through computation of a computing circuit. Thus, the magnetic field sensing apparatus 100 may have a simpler framework, and a manufacturing cost thereof may be reduced.

In this embodiment, the magnetic field sensing apparatus 100 further includes a first magnetization direction setting element 200 and a second magnetization direction setting element 300. The first magnetization direction setting element 200 is disposed beside the first magnetic field sensing unit 120 and configured to set the magnetization directions of the magnetoresistance sensors 122 of the first magnetic field sensing unit 120. The second magnetization direction setting element 300 is disposed beside the second magnetic field sensing unit 130 and the third magnetic field sensing unit 140 and configured to set the magnetization directions of the magnetoresistance sensors 132 and 142 of the second magnetic field sensing unit 130 and the third magnetic field sensing unit 140.

Specifically, in this embodiment, each of the first magnetization direction setting element 200 and the second magnetization direction setting element 300 includes a first spiral conductive unit 210, a second spiral conductive unit 220, and a third spiral conductive unit 230. In the following, the first magnetization direction setting element 200 is described as an example. The second spiral conductive unit 220 is electrically connected between the first spiral conductive unit 210 and the third spiral conductive unit 230. In addition, a spirally extending direction of the second spiral conductive unit 220 is different from a spirally extending direction of the first spiral conductive unit 210 and different from a spirally extending direction of the third spiral conductive unit 230. In this embodiment, a spirally extending direction is defined as a current flow direction when the first spiral conductive unit 210, the second spiral conductive unit 220, and the third spiral conductive unit 230 are serially connected, for example.

Referring to FIG. 1C, when a current is injected from a terminal C1, the current sequentially flows through a conductive segment 240 and a terminal C2 into the first spiral conductive unit 210. In addition, the current flow to a terminal C3 in a counterclockwise direction in the first spiral conductive unit 210. Then, the current flows from the terminal C3 to a terminal C4 through a conductive segment 250. Subsequently, after flowing through the second spiral conductive unit 220 in a clockwise direction from the terminal C4, the current flows to a terminal C5 through the third spiral conductive unit 230 in a counterclockwise direction. Finally, the current flows from the terminal C5 to a terminal C6 through a conductive segment 260, and flows out from the terminal C6. Thus, in FIG. 1C, the spirally extending direction of the first spiral conductive unit 210 is counterclockwise, the spirally extending direction of the second spiral conductive unit 220 is clockwise, and the spirally extending direction of the third spiral conductive unit 230 is counterclockwise.

In this embodiment, conductive segments of the first spiral conductive unit 210 and the second spiral conductive unit 220 respectively having current flow directions E1, E2, and E3 are located right above the magnetoresistance sensors 122a and 122b. In addition, the current flow directions E1, E2, and E2 are toward the +x-direction. Thus, the magnetization directions of the magnetoresistance sensors 122a and 122b may be set to be the −y-direction. Besides, conductive segments of the second spiral conductive unit 220 and the third spiral conductive unit 230 having current flow directions E4, E5, and E6 are located right above the magnetoresistance sensors 122c and 122d. In addition, the current flow directions E4, E5, and E6 are toward the −x-direction. Thus, the magnetization directions of the magnetoresistance sensors 122c and 122d may be set to be the +y-direction. Accordingly, when power is supplied to the first magnetization direction setting element 200, the magnetization directions of the magnetoresistance sensors 122a to 122d may be set to suitable initial values to allow the first magnetic field sensing unit 120 to correctly sense the magnetic field component of the x-direction.

In other words, when the current sequentially flows through the first spiral conductive unit 210, the second spiral conductive unit 220, and the third spiral conductive unit 230, the current right above or below (right above, for example) the magnetoresistance sensors 122a and 122b belonging to a half bridge of the Wheatstone bridge flows toward a first direction (e.g., +x-direction), and the current right above or below (right above, for example) the magnetoresistance sensors 122c and 122d belonging to the other half bridge of the Wheatstone bridge flows toward a second direction (e.g., −x-direction). In addition, the first direction (e.g., +x-direction) is opposite to the second direction (e.g., −x-direction).

In the same light, the first spiral conductive unit 210, the second spiral conductive unit 220, and the third spiral conductive unit 230 of the second magnetization direction setting element 300 may be disposed above the second magnetic field sensing unit 130 and the third magnetic field sensing unit 140. In addition, the first spiral conductive unit 210, the second spiral conductive unit 220, and the third spiral conductive unit 230 of the first magnetization direction setting element 200 are arranged along the y-direction. However, the first spiral conductive unit 210, the second spiral conductive unit 220, and the third spiral conductive unit 230 of the second magnetization direction setting element 300 may be arranged along the x-direction, so as to be configured to set the magnetization directions of the magnetoresistance sensors 132a, 132b, 142a, and 142b.

In this embodiment, the first magnetization direction setting element 200 and the first magnetic field sensing unit 120 may form a magnetic field sensing module 400 to measure the magnetic field component in the x-direction. Besides, the second magnetization direction setting element 300, the second magnetic field sensing unit 130, and the third magnetic field sensing unit 140 may form a magnetic field sensing module 500 to measure the magnetic field components in the y-direction and the z-direction.

In the magnetic field sensing modules 400 and 500 of this embodiment, since the spirally extending direction of the second spiral conductive unit 220 is different from the spirally extending direction of the first spiral conductive unit 210 and different from the spirally extending direction of the third spiral conductive unit 230, the magnetization directions of the magnetoresistance sensors 122, 132, and 142 of the magnetic field sensing units (e.g., the first magnetic field sensing unit 120, the second magnetic field sensing unit 130, and the third magnetic field sensing unit 140) may be set effectively by simply using three spiral conductive units. Thus, the magnetic field sensing modules 400 and 500 of this embodiment have a simpler framework and the sizes thereof may be smaller.

Besides, since the frameworks of the first magnetization direction setting element 200 and the second magnetization direction setting element 300 are simpler, and a routing length is shorter, the resistance becomes smaller. Thus, with the same voltage applied, the current may have a higher intensity, so the magnetic field generated by the first magnetization direction setting element 200 and the second magnetization direction setting element 300 may be stronger. Thus, the magnetic field sensing modules 400 and 500 may have a greater sensing range.

Furthermore, by using the first magnetization direction setting element 200 and the second magnetization direction setting element 300, the arrangement of the magnetization directions of the first magnetic field sensing unit 120, the second magnetic field sensing unit 130, and the third magnetic field sensing unit 140 may be initialized, such that the first magnetic field sensing unit 120, the second magnetic field sensing unit 130, and the third magnetic field sensing unit 140 may be used normally after an impact of a strong external magnetic field. Besides, by changing current directions of the first magnetization direction setting element 200 and the second magnetization direction setting element 300 to form different arrangements of the magnetization directions of the first magnetic field sensing unit 120, the second magnetic field sensing unit 130, and the third magnetic field sensing unit 140, dynamic system offsets of the first magnetic field sensing unit 120, the second magnetic field sensing unit 130, and the third magnetic field sensing unit 140 may be measured. By subtracting measured values from the dynamic system offsets, values of magnetic field components may be obtained more accurately and quickly. In the same light, low frequency noises may be eliminated to make the values of the magnetic field components measured more accurate.

Figure 3:
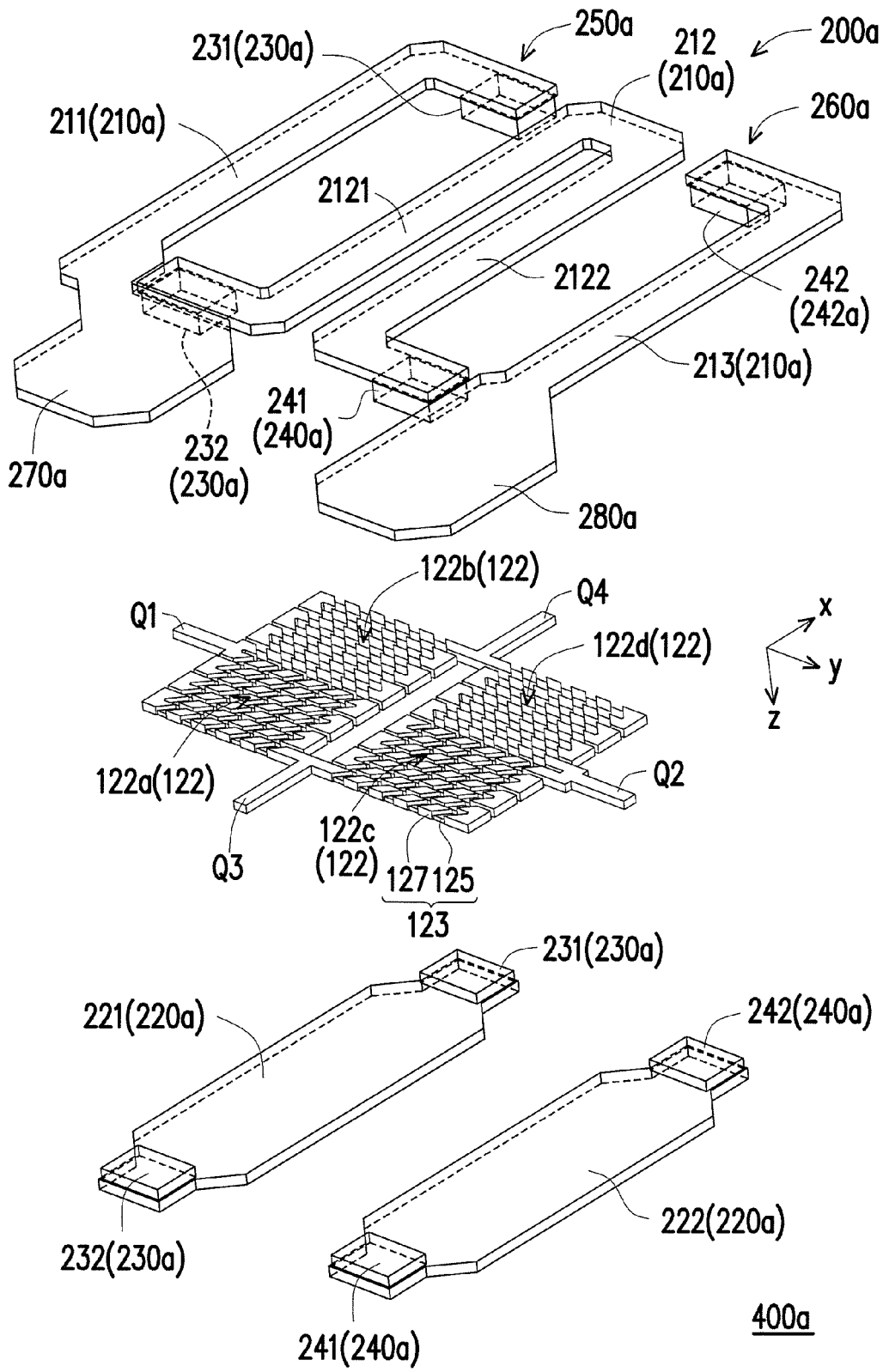
FIG. 3 is an exploded view illustrating a magnetic field sensing module according to another embodiment of the invention.

FIG. 3 is an exploded view illustrating a magnetic field sensing module according to another embodiment of the invention. Referring to FIG. 3, a magnetic field sensing module 400a of this embodiment is similar to the magnetic field sensing module 400 of FIG. 1C. Main differences therebetween are described in the following. In the magnetic field sensing module 400*a* of this embodiment, a first magnetization direction setting element 200*a* includes a plurality of first conductive segments 210*a*, a plurality of second conductive segments 220*a*, a plurality of first conductive vias 230*a*, and a plurality of second conductive vias 240*a*. The first conductive segments 210*a* are disposed on one of an upper side and a lower side (upper side in this embodiment, for example) of the first magnetic field sensing unit 120, and the second conductive segments 220*a* are disposed on the other of the upper side and the lower side (lower side in this embodiment, for example) of the first magnetic field sensing unit 120. The first conductive vias 230*a* connect a portion of the first conductive segments 210*a* and a portion of the second conductive segments 220*a* to form a first spiral conductive unit 250*a*. The second conductive vias 240*a* connect another portion of the first conductive segments 210*a* and another portion of the second conductive segments 220*a* to form a second spiral conductive unit 260*a*. In addition, a spirally extending direction of the first spiral conductive unit 250*a* is different from a spirally extending direction of the second spiral conductive unit 260*a*.

In this embodiment, a current flowing into a first conductive segment 211 from a contact 270*a* may flow to a first conductive via 231 through the first conductive segment 211, and then flows to a first conductive via 232 through a second conductive segment 221. Then, the current flows through a first portion 2121 of a first conductive segment 212 from the first conductive via 232. Thus far, the current flows in a clockwise direction, and the first conductive segment 211, the first conductive via 231, the second conductive segment 221, the first conductive via 232, and the first portion 2121 of the first conductive segment 212 form the first spiral conductive unit 250*a*. The spirally extending direction of the first spiral conductive unit 250*a* is clockwise.

Then, the current flows from the first portion 2121 to a second portion 2122 of the first conductive segment 212. Then, the current flows to a second conductive segment 222 through a second conductive via 241 after flowing through the second portion 2122. Afterwards, the current flows from the second conductive segment 222 to a first conductive segment 213 through a second conductive via 242. Finally, the current flows from the first conductive segment to a contact 280*a*, and flows out of the first magnetization direction setting element 200*a* from the contact 280*a*. In this way, from the second portion 2122, the current flows in a counterclockwise direction. In addition, the second portion 2122, the first conductive via 241, the second conductive segment 222, the second conductive via 242, and the first conductive segment 213 form the second spiral conductive unit 260*a*. The spirally extending direction of the second spiral conductive unit 260*a* is a counterclockwise direction.

In this embodiment, the first spiral conductive unit 250*a* is wound on the magnetoresistance sensors 122*a* and 122*b*. Thus, the magnetization directions of the magnetoresistance sensors 122*a* and 122*b* may be set to be the −y-direction. Besides, the second spiral conductive unit 260*a* is wound on the magnetoresistance sensors 122*c* and 122*d*. Thus, the magnetization directions of the magnetoresistance sensors 122*c* and 122*d* may be set to be the +y-direction.

In this embodiment, one of the first conductive segments 210*a* (the first conductive segment 212, for example) is a U-shaped conductive segment. A portion of the U-shaped conductive segment (i.e., the first portion 2121) belongs to the first spiral conductive unit 250*a*, and another portion of the U-shaped conductive segment (i.e., the second portion 2122) belongs to the second spiral conductive unit 260*a*.

In this embodiment, the second magnetization direction setting element may also have the first spiral conductive unit 250*a* and the second spiral conductive unit 260*a* as those of the first magnetization direction setting element 200*a*. In addition, the first spiral conductive unit 250*a* is wound on the magnetoresistance sensors 132*b* and 142*b*, the second spiral conductive unit 260*a* is wound on the magnetoresistance sensors 132*a* and 142*a*, and the first spiral conductive unit 250*a* and the second spiral conductive unit 260*a* are arranged along the −x-direction.

In the magnetic field sensing module 400*a* of this embodiment, since the spirally extending direction of the first spiral conductive unit 250*a* is different from the spirally extending direction of the second spiral conductive unit 260*a*, the magnetization directions of the magnetoresistance sensors 122 and 142 of the magnetic field sensing units (e.g., the first magnetic field sensing unit 120, the second magnetic field sensing unit 130) may be effectively set by simply using the first conductive segments 210*a*, the second conductive segments 220*a*, and the conductive vias (e.g., the first conductive via 230*a* and the second conductive via 240*a*). Thus, the magnetic field sensing module 400*a* of this embodiment has a simpler framework and a smaller size. Besides, since the frameworks of the first magnetization direction setting element 200*a* is simpler, and a routing length is shorter, the resistance thereof becomes smaller. Thus, with the same voltage applied, the current may have a higher intensity, so the magnetic field generated by the first magnetization direction setting element 200*a* may be stronger. Thus, the magnetic field sensing module 400*a* may have a greater sensing range.

In this embodiment, the first conductive segments 210*a* and the second conductive segments 220*a* are partially overlapped. For example, an edge of the first conductive segment 211 at a side (i.e., the lower right side in FIG. 3) of the +y-direction is overlapped with an edge of the second conductive segment 221 at a side of the −y-direction (i.e., the upper left side in FIG. 3), and an edge of the second conductive segment 221 at a side of the +y-direction is overlapped with an edge of the first portion 2121 of the first conductive segment 212 at a side of the −y-direction. In addition, an edge of the second portion 2122 of the first conductive segment 212 at a side of the +y-direction is overlapped with an edge of the second conductive segment 222 at a side of the −y-direction. In addition, an edge of the second conductive segment 222 at a side of the +y-direction is overlapped with an edge of the first conductive segment 213 at a side of the −y-direction. When the first conductive segments 210*a* and the second conductive segments 220*a* are partially overlapped, with the same current, the first spiral conductive unit 250*a* and the second spiral conductive unit 260*a* may generate a stronger magnetic field. Thus, the magnetic field sensing module 400*a* of this embodiment may have a greater sensing range.

Figure 4:
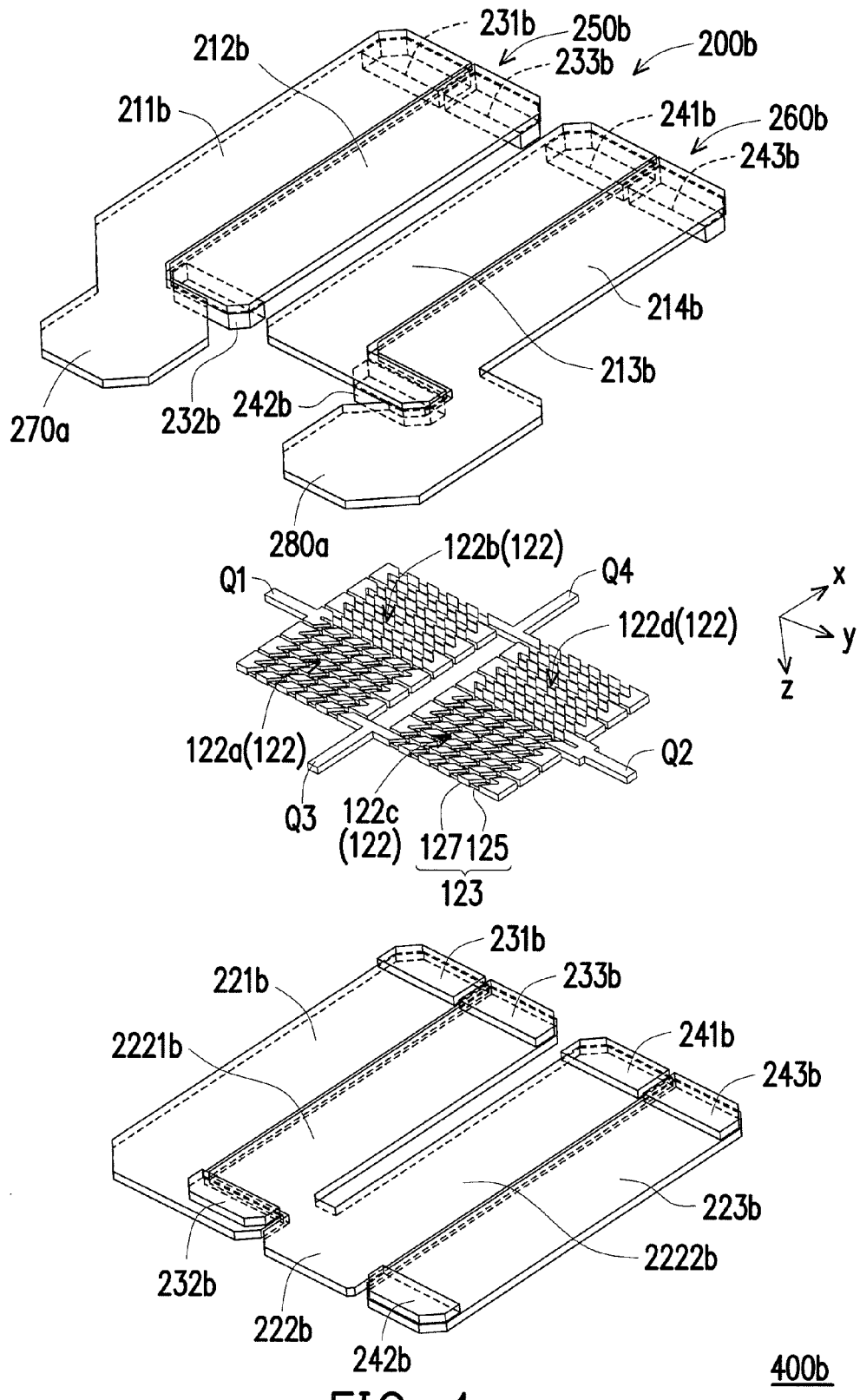
FIG. 4 is an exploded view illustrating a magnetic field sensing module according to still another embodiment of the invention.

FIG. 4 is an exploded view illustrating a magnetic field sensing module according to still another embodiment of the invention. Referring to FIG. 4, a magnetic field sensing module 400*b* of this embodiment is similar to the magnetic field sensing module 400*a* of FIG. 3. Main differences therebetween are described in the following. In the magnetic field sensing module 400*b* of this embodiment, a first magnetization direction setting element 200*b* includes a plurality of first conductive segments 211*b*, 212*b*, 213*b*, and 214*b*, a plurality of second conductive segments 221*b*, 222*b*, and 223b, a plurality of first conductive vias 231b, 232b, and 233b, and a plurality of second conductive vias 241b, 242b, and 243b.

In this embodiment, a current flowing into the first conductive segment 211b from the contact 270a may flow to the first conductive via 231b through the first conductive segment 211b, and then flows to the first conductive via 232b through the second conductive segment 221b. Then, the current flows from the first conductive via 232b to the first conductive via 233b via the first conductive segment 212b, and then flows through a first portion 2221b of the second conductive segment 222b from the first conductive via 233b. Thus far, the current flows in a clockwise direction, and the first conductive segment 211b, the first conductive via 231b, the second conductive segment 221b, the first conductive via 232b, the first conductive segment 212b, the first conductive via 233b, and the first portion 2221b of the second conductive segment 222b form a first spiral conductive unit 250b, and a spirally extending direction of the first spiral conductive unit 250b is a clockwise direction.

Then, the current flows from the first portion 2221b to a second portion 2222b of the second conductive segment 222b. Then, the current flows to the first conductive segment 213b through the second conductive via 241b after flowing through the second portion 2222b. Then, the current flows through the first conductive segment 213b to the second conductive via 242b, and then flows from the second conductive via 242b to the second conductive via 243b through the second conductive segment 223b. Finally, the current flows from the second conductive via 243b to the contact 280a through the first conductive segment 214b, and flows out of the first magnetization direction setting element 200b from the contact 280a. In this way, from the second portion 2222b, the current flows in a counterclockwise direction. In addition, the second portion 2222b, the second conductive via 241b, the first conductive segment 213b, the second conductive via 242b, and the second conductive segment 223b, the second conductive via 243b, and the first conductive segment 214b form a second spiral conductive unit 260b. A spirally extending direction of the second spiral conductive unit 260b is a counterclockwise direction.

In this embodiment, the first spiral conductive unit 250b is wound on the magnetoresistance sensors 122a and 122b, so as to set the magnetization directions of the magnetoresistance sensors 122a and 122b to be the −y-direction. Besides, the second spiral conductive unit 260b is wound on the magnetoresistance sensors 122c and 122d. Thus, the magnetization directions of the magnetoresistance sensors 122c and 122d may be set to be the +y-direction.

In this embodiment, one of the second conductive segments (the second conductive segment 222b, for example) is a U-shaped conductive segment. A portion of the U-shaped conductive segment (i.e., the first portion 2221b) belongs to the first spiral conductive unit 250b, and another portion of the U-shaped conductive segment (i.e., the second portion 2222b) belongs to the second spiral conductive unit 260b. In this embodiment, the conductive segment above the first magnetic field sensing unit 120b is named as first conductive segment, and the conductive segment below the first magnetic field sensing unit 120 is named as second conductive segment. Actually, the conductive segment below the first magnetic field sensing unit 120 may also be named as first conductive segment, the conductive segment above the first magnetic field sensing unit 120 may be named as second conductive segment, and the U-shaped conductive segment thus belongs to the first conductive segment.

In this embodiment, the second magnetization direction setting element may also have the first spiral conductive unit 250b and the second spiral conductive unit 260b as those of the first magnetization direction setting element 200b. In addition, the first spiral conductive unit 250b is wound on the magnetoresistance sensors 132b and 142b, the second spiral conductive unit 260b is wound on the magnetoresistance sensors 132a and 142a, and the first spiral conductive unit 250b and the second spiral conductive unit 260b are arranged along the −x-direction.

In this embodiment, the first conductive segments and the second conductive segments are at least partially overlapped, and an overlapping area is greater than an overlapping area in the embodiment shown in FIG. 3. Therefore, a magnetic field generation efficiency is greater.

Figure 5:
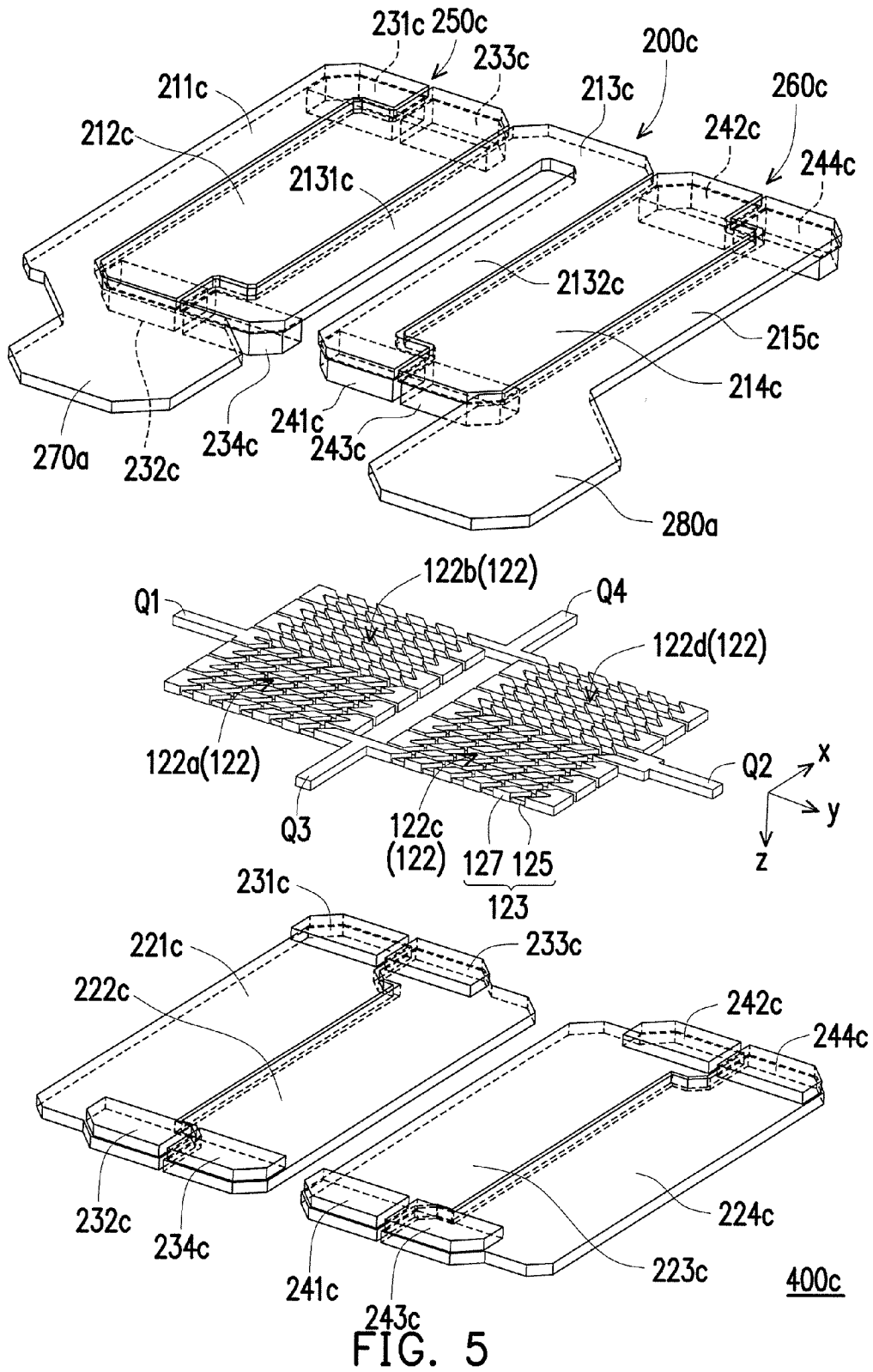
FIG. 5 is an exploded view illustrating a magnetic field sensing module according to yet another embodiment of the invention.

FIG. 5 is an exploded view illustrating a magnetic field sensing module according to yet another embodiment of the invention. Referring to FIG. 5, a magnetic field sensing module 400c of this embodiment is similar to the magnetic field sensing module 400a of FIG. 3. Main differences therebetween are described in the following. In the magnetic field sensing module 400c of this embodiment, a first magnetization direction setting element 200c includes a plurality of first conductive segments 211c, 212c, 213c, 214c, and 215c, a plurality of second conductive segments 221c, 222c, 223c, and 224c, a plurality of first conductive vias 231c, 232c, 233c, and 234c, and a plurality of second conductive vias 241c, 242c, 243b, and 244c.

In this embodiment, a current flowing into the first conductive segment 211c from the contact 270a may flow to the first conductive via 231c through the first conductive segment 211c, and then flows to the first conductive via 232c through the second conductive segment 221c. Then, the current flows from the first conductive via 232c to the first conductive via 233c through the first conductive segment 212c, and then flows from the first conductive via 233c to the first conductive via 234c through the second conductive segment 222c. Then, the current flows through a first portion 2131c of the first conductive via 213c from the first conductive via 234c. Thus far, the current flows in a clockwise direction, and the first conductive segment 211c, the first conductive via 231c, the second conductive segment 221c, the first conductive via 232c, the first conductive segment 212c, the first conductive via 233c, the second conductive segment 222c, the first conductive via 234c, and the first portion 2131c of the first conductive segment 213c form a first spiral conductive unit 250c, and a spirally extending direction of the first spiral conductive unit 250c is a clockwise direction.

Then, the current flows from the first portion 2131c to a second portion 2132c of the first conductive segment 213c. Then, the current flows to the second conductive segment 223c through the second conductive via 241c after flowing through the second portion 2132c. Then, the current flows to the second conductive via 242c through the second conductive segment 223c, and then flows from the second conductive via 242c to the second conductive via 243c through the first conductive segment 214c. Afterwards, the current flows from the second conductive via 243c to the second conductive via 244c through the second conductive segment 224c. Finally, the current flows from the second conductive via 244c to the contact 280a through the first conductive segment 215c, and flows out of the first magnetization direction setting element 200c from the contact 280a. In this way, from the second portion 2132c, the current flows in a counterclockwise direction. In addition, the second portion 2132c, the second conductive via 241c, the second conductive segment 223c, the second conductive via 242c, the first conductive segment 214c, the second conductive via 243c, the second conductive segment 224c, the second conductive via 244c, and the first conductive segment 215c form a second spiral conductive unit 260c. A spirally extending direction of the second spiral conductive unit 260c is a counterclockwise direction.

In this embodiment, the first spiral conductive unit 250c is wound on the magnetoresistance sensors 122a and 122b, so as to set the magnetization directions of the magnetoresistance sensors 122a and 122b to be the −y-direction. Besides, the second spiral conductive unit 260c is wound on the magnetoresistance sensors 122c and 122d. Thus, the magnetization directions of the magnetoresistance sensors 122c and 122d may be set to be the +y-direction.

In this embodiment, one of the first conductive segments (the first conductive segment 213c, for example) is a U-shaped conductive segment. A portion of the U-shaped conductive segment (i.e., the first portion 2131c) belongs to the first spiral conductive unit 250c, and another portion of the U-shaped conductive segment (i.e., the second portion 2132c) belongs to the second spiral conductive unit 260c.

In this embodiment, the second magnetization direction setting element may also have the first spiral conductive unit 250c and the second spiral conductive unit 260c as those of the first magnetization direction setting element 200c. In addition, the first spiral conductive unit 250c is wound on the magnetoresistance sensors 132b and 142b, the second spiral conductive unit 260c is wound on the magnetoresistance sensors 132a and 142a, and the first spiral conductive unit 250c and the second spiral conductive unit 260c are arranged along the −x-direction.

In this embodiment, the first conductive segments and the second conductive segments are at least partially overlapped, and an overlapping area is greater than the overlapping area in the embodiment shown in FIG. 3. Therefore, a magnetic field generation efficiency is greater.

In view of the foregoing, in the magnetic field sensing apparatus according to the embodiments of the invention, since the second magnetic field sensing unit and the third magnetic field sensing unit may form two different Wheatstone full bridges through circuit switching, so as to sense the magnetic field components in the second direction and the third direction, respectively, the magnetic field sensing apparatus is able to sense the magnetic field components in three directions by using fewer magnetoresistance sensors. Thus, the framework of the magnetic field sensing apparatus may be simplified, and the size of the magnetic field sensing apparatus may be reduced. In the magnetic field sensing module according to the embodiments of the invention, since the spirally extending direction of the second spiral conductive unit is different from the spirally extending direction of the first spiral conductive unit and different from the spirally extending direction of the third spiral conductive unit, the magnetization directions of the magnetoresistance sensors of the magnetic field sensing units may be set effectively by simply using three spiral conductive units. Thus, the magnetic field sensing module according to the embodiments of the invention has a simpler framework and a smaller size. In the magnetic field sensing module according to the embodiments of the invention, since the spirally extending direction of the first spiral conductive unit is different from the spirally extending direction of the second spiral conductive unit, the magnetization directions of the magnetoresistance sensors of the magnetic field sensing units may be effectively set by simply using the first conductive segments, the second conductive segments, and the conductive vias. Thus, the magnetic field sensing module according to the embodiments of the invention has a simpler framework and a smaller size.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic field sensing apparatus, comprising:
a substrate having a horizontal surface and a first inclined surface and a second inclined surface inclined in different directions with respect to the horizontal surface;
a first magnetic field sensing unit comprising a plurality of magnetoresistance sensors connected to form a Wheatstone full bridge and disposed on the horizontal surface and configured to sense a magnetic field component in a first direction;
a second magnetic field sensing unit comprising a plurality of magnetoresistance sensors connected to form a Wheatstone half bridge and disposed on the first inclined surface;
a third magnetic field sensing unit comprising a plurality of magnetoresistance sensors connected to form a Wheatstone half bridge and disposed on the second inclined surface; and
a switching circuit electrically connecting the second magnetic field sensing unit and the third magnetic field sensing unit and configured to switch the second magnetic field sensing unit and the third magnetic field sensing unit to two different Wheatstone full bridges, wherein the two different Wheatstone full bridges are respectively configured to sense a magnetic field component in a second direction and a magnetic field component in a third direction.

2. The magnetic field sensing apparatus as claimed in claim 1, wherein the magnetoresistance sensors of the first magnetic field sensing unit, the second magnetic field sensing unit, and the third magnetic field sensing unit are anisotropic magentoresistance sensors.

3. The magnetic field sensing apparatus as claimed in claim 1, wherein the first direction, the second direction, and the third direction are substantially perpendicular to each other.

4. The magnetic field sensing apparatus as claimed in claim 1, wherein at least two of the first direction, the second direction, and the third direction are not perpendicular to each other.

5. The magnetic field sensing apparatus as claimed in claim 1, wherein sensing axes of the magnetoresistance sensors of the second magnetic field sensing unit are substantially parallel to an inclinedly extending direction of the first inclined surface, and sensing axes of the magnetoresistance sensors of the third magnetic field sensing unit are substantially parallel to an inclinedly extending direction of the second inclined surface.

6. The magnetic field sensing apparatus as claimed in claim 5, wherein sensing axes of the magnetoresistance sensors of the first magnetic field sensing unit are substantially perpendicular to the inclinedly extending direction of the first inclined surface and perpendicular to the inclinedly extending direction of the second inclined surface.

7. The magnetic field sensing apparatus as claimed in claim 1, further comprising:

a first magnetization direction setting element disposed beside the first magnetic field sensing unit and configured to set magnetization directions of the magnetoresistance sensors of the first magnetic field sensing unit; and a second magnetization direction setting element disposed beside the second magnetic field sensing unit and the third magnetic field sensing unit and configured to set magnetization directions of the magnetoresistance sensors of the second magnetic field sensing unit and the third magnetic field sensing unit.

8. The magnetic field sensing apparatus as claimed in claim 7, wherein each of the first magnetization direction setting element and the second magnetization direction setting element comprises:
a first spiral conductive unit;
a second spiral conductive unit; and
a third spiral conductive unit, wherein the second spiral conductive unit is electrically connected between the first spiral conductive unit and the third spiral conductive unit, and a spirally extending direction of the second spiral conductive unit is different from a spirally extending direction of the first spiral conductive unit and different from a spirally extending direction of the third spiral conductive unit.

9. The magnetic field sensing apparatus as claimed in claim 7, wherein the first magnetization direction setting element comprises:
a plurality of first conductive segments disposed on one of an upper side and a lower side of the first magnetic field sensing unit;
a plurality of second conductive segments disposed on the other of the upper side and the lower side of the first magnetic field sensing unit;
a plurality of first conductive vias connecting a portion of the first conductive segments and a portion of the second conductive segments to form a first spiral conductive unit; and
a plurality of second conductive vias connecting another portion of the first conductive segments and another portion of the second conductive segments to form a second spiral conductive unit, wherein a spirally extending direction of the first spiral conductive unit is different from a spirally extending direction of the second spiral conductive unit, and
the second magnetization direction setting element comprises:
a plurality of third conductive segments disposed on one of an upper side and a lower side of the second magnetic field sensing unit and the third magnetic field sensing unit;
a plurality of fourth conductive segments disposed on the other of the upper side and the lower side of the second magnetic field sensing unit and the third magnetic field sensing unit;
a plurality of third conductive vias connecting a portion of the third conductive segments and a portion of the fourth conductive segments to form a third spiral conductive unit; and
a plurality of second conductive vias connecting another portion of the third conductive segments and another portion of the fourth conductive segments to form a fourth spiral conductive unit, wherein a spirally extending direction of the third spiral conductive unit is different from a spirally extending direction of the fourth spiral conductive unit.

10. The magnetic field sensing apparatus as claimed in claim 9, wherein one of the first conductive segments is a first U-shaped conductive segment, a portion of the first U-shaped conductive segment belongs to the first spiral conductive unit, and another portion of the first U-shaped conductive segment belongs to the second spiral conductive unit, one of the third conductive segments is a second U-shaped conductive segment, a portion of the second U-shaped conductive segment belongs to the third spiral conductive unit, and another portion of the second U-shaped conductive segment belongs to the fourth spiral conductive unit.

11. The magnetic field sensing apparatus as claimed in claim 9, wherein the first conductive segments and the second conductive segments are partially overlapped, and the third conductive segments and the fourth conductive segments are partially overlapped.

12. A magnetic field sensing module, comprising:
a magnetic field sensing unit comprising a plurality of magnetoresistance sensors connected to form a Wheatstone bridge and configured to sense a magnetic field component in a direction;
a magnetization direction setting element disposed beside the magnetic field sensing unit and configured to set magnetization directions of the magnetoresistance sensors of the magnetic field sensing unit, wherein the magnetization direction setting element comprises:
a first spiral conductive unit;
a second spiral conductive unit; and
a third spiral conductive unit, wherein the second spiral conductive unit is electrically connected between the first spiral conductive unit and the third spiral conductive unit, and a spirally extending direction of the second spiral conductive unit is different from a spirally extending direction of the first spiral conductive unit and different from a spirally extending direction of the third spiral conductive unit.

13. The magnetic field sensing module as claimed in claim 12, wherein the magnetoresistance sensors are anisotropic magnetoresistance sensors.

14. The magnetic field sensing module as claimed in claim 12, wherein when a current sequentially flows through the first spiral conductive unit, the second spiral conductive unit, and the third spiral conductive unit, a current right above or right below the magnetoresistance sensors belonging to a half bridge of the Wheatstone full bridge flows in a first direction, a current right above or right below the magnetoresistance sensors belonging to the other half of the Wheatstone bridge flows in a second direction, and the first direction is opposite to the second direction.

15. A magnetic field sensing module, comprising:
a magnetic field sensing unit comprising a plurality of magnetoresistance sensors connected to form a Wheatstone bridge and configured to sense a magnetic field component in a direction;
a magnetization direction setting element disposed beside the magnetic field sensing unit and configured to set magnetization directions of the magnetoresistance sensors of the magnetic field sensing unit, wherein the magnetization direction setting element comprises:
a plurality of first conductive segments disposed on one of an upper side and a lower side of the magnetic field sensing unit;
a plurality of second conductive segments disposed on the other of an upper side and a lower side of the magnetic field sensing unit;

a plurality of first conductive vias connecting a portion of the first conductive segments and a portion of the second conductive segments to form a first spiral conductive unit; and a plurality of second conductive vias connecting another portion of the first conductive segments and another portion of the second conductive segments to form a second spiral conductive unit, wherein a spirally extending direction of the first spiral conductive unit is different from a spirally extending direction of the second spiral conductive unit.

16. The magnetic field sensing module as claimed in claim 15, wherein one of the first conductive segments is a U-shaped conductive segment, a portion of the U-shaped conductive segment belongs to the first spiral conductive unit, and another portion of the U-shaped conductive segment belongs to the second spiral conductive unit.

17. The magnetic field sensing module as claimed in claim 15, wherein the first conductive segments and the second conductive segments are partially overlapped.

18. The magnetic field sensing module as claimed in claim 15, wherein the magnetoresistance sensors are anisotropic magnetoresistance sensors.

* * * * *